United States Patent
He et al.

(10) Patent No.: US 12,207,436 B2
(45) Date of Patent: Jan. 21, 2025

(54) METHOD AND APPARATUS FOR A ROTATING ION EMITTER

(71) Applicant: Dell Products, LP, Round Rock, TX (US)

(72) Inventors: Qinghong He, Austin, TX (US); Travis C. North, Cedar Park, TX (US); Mitchell Anthony Markow, Hutto, TX (US)

(73) Assignee: DELL PRODUCTS LP, Round Rock, TX (US)

( * ) Notice: Subject to any disclaimer, the term of this patent is extended or adjusted under 35 U.S.C. 154(b) by 178 days.

(21) Appl. No.: 17/967,579

(22) Filed: Oct. 17, 2022

(65) Prior Publication Data

US 2024/0130073 A1     Apr. 18, 2024

(51) Int. Cl.
*H05K 7/20* (2006.01)
*G06F 1/20* (2006.01)
*G06F 11/30* (2006.01)

(52) U.S. Cl.
CPC ......... *H05K 7/20172* (2013.01); *G06F 1/206* (2013.01); *G06F 11/3058* (2013.01); *H05K 7/20209* (2013.01); *H05K 7/20409* (2013.01)

(58) Field of Classification Search
CPC ..... H05K 7/20; H05K 7/20136–20145; H05K 7/20154; H05K 7/20172; H05K 7/20181; H05K 7/2019; H05K 7/20209; H05K 7/20409; H05K 7/20718; H05K 7/20736; H05K 5/00; H05K 5/02; H05K 5/0213; H01L 23/34; H01L 23/367;
(Continued)

(56) References Cited

U.S. PATENT DOCUMENTS 5,055,963 A  *  10/1991  Partridge ................ H01T 23/00
                                                          361/231
7,545,640 B2     6/2009  Fisher
(Continued)

FOREIGN PATENT DOCUMENTS

CN       114383248 A  *  4/2022
WO    2007/112763 A1    10/2007
(Continued)

OTHER PUBLICATIONS

CN-114383248-A English Translation (Year: 2022).*

*Primary Examiner* — Amir A Jalali
(74) *Attorney, Agent, or Firm* — Prol Intellectual Property Law, PLLC; H. Kenneth Prol

(57) ABSTRACT

An information handling system includes a processor, a memory device, and a power management unit (PMU) to provide power to the processor and memory device. The information handling system may also include an ion emitter fan cooling system that includes an ion emitter fan housed within an ion emitter fan housing that includes a plurality of emitter fan blades that rotate with tips operating as ion emitters. The ion emitter fan cooling system may also include an ionic driving circuit operatively coupled to the ion emitter fan and the plurality of emitter fan blades to provide a free electron source at tips of the plurality of emitter fan blades to ionize gases as an emitter within the ion emitter fan housing and create charged ions to create an airflow out of an external opening of the ion emitter fan housing having a collector.

20 Claims, 6 Drawing Sheets

(58) Field of Classification Search
CPC ......... H01L 23/3675; H01L 23/46–467; F04D 25/08; F04D 25/12; F04D 25/14; F04D 29/22; F04D 29/281; F04D 29/30; F04D 29/325; F04D 29/329; F04D 29/4226; F04D 29/584; F04D 29/626; F04D 29/646; F24F 7/00; F24F 7/007; F24F 13/00; F24F 13/10; F24F 13/14; F24F 13/20; F24F 11/00; F24F 11/30; F25D 2323/00284; G06F 1/20; G06F 1/203; G06F 1/206; G06F 11/3058

See application file for complete search history.

(56) References Cited

U.S. PATENT DOCUMENTS

| | | | |
|---|---|---|---|
| 2002/0071235 A1* | 6/2002 | Gorczyca | H01T 23/00 361/231 |
| 2004/0012909 A1* | 1/2004 | Gorczyca | H01T 23/00 361/231 |
| 2005/0214180 A1 | 9/2005 | Joannou | |
| 2011/0036552 A1 | 2/2011 | Lu | |
| 2011/0094710 A1* | 4/2011 | Choudhary | H01T 23/00 165/104.34 |
| 2011/0261499 A1* | 10/2011 | Hizer | H01T 23/00 361/231 |
| 2012/0007742 A1 | 1/2012 | Gooch | |
| 2012/0008248 A1 | 1/2012 | Sawyer | |
| 2012/0057356 A1 | 3/2012 | Hizer | |
| 2013/0021715 A1 | 1/2013 | Jewell-Larsen | |
| 2015/0108363 A1* | 4/2015 | Kanazawa | F04D 29/005 417/234 |
| 2016/0265856 A1 | 9/2016 | Saveliev | |
| 2021/0143722 A1* | 5/2021 | Ieta | B63H 7/02 |

FOREIGN PATENT DOCUMENTS

| | | |
|---|---|---|
| WO | 2009/131980 A2 | 10/2009 |
| WO | 2012/006361 A2 | 1/2012 |

* cited by examiner

METHOD AND APPARATUS FOR A ROTATING ION EMITTER

FIELD OF THE DISCLOSURE

The present disclosure generally relates to cooling systems for information handling system. The present disclosure more specifically relates to ion emitters used to cool an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. Under various operating conditions, especially high-performance conditions, information handling systems may generate heat which, if not mitigated, may affect performance. The information handling system may thus include a cooling system used to cool hardware therein such as a processing device.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
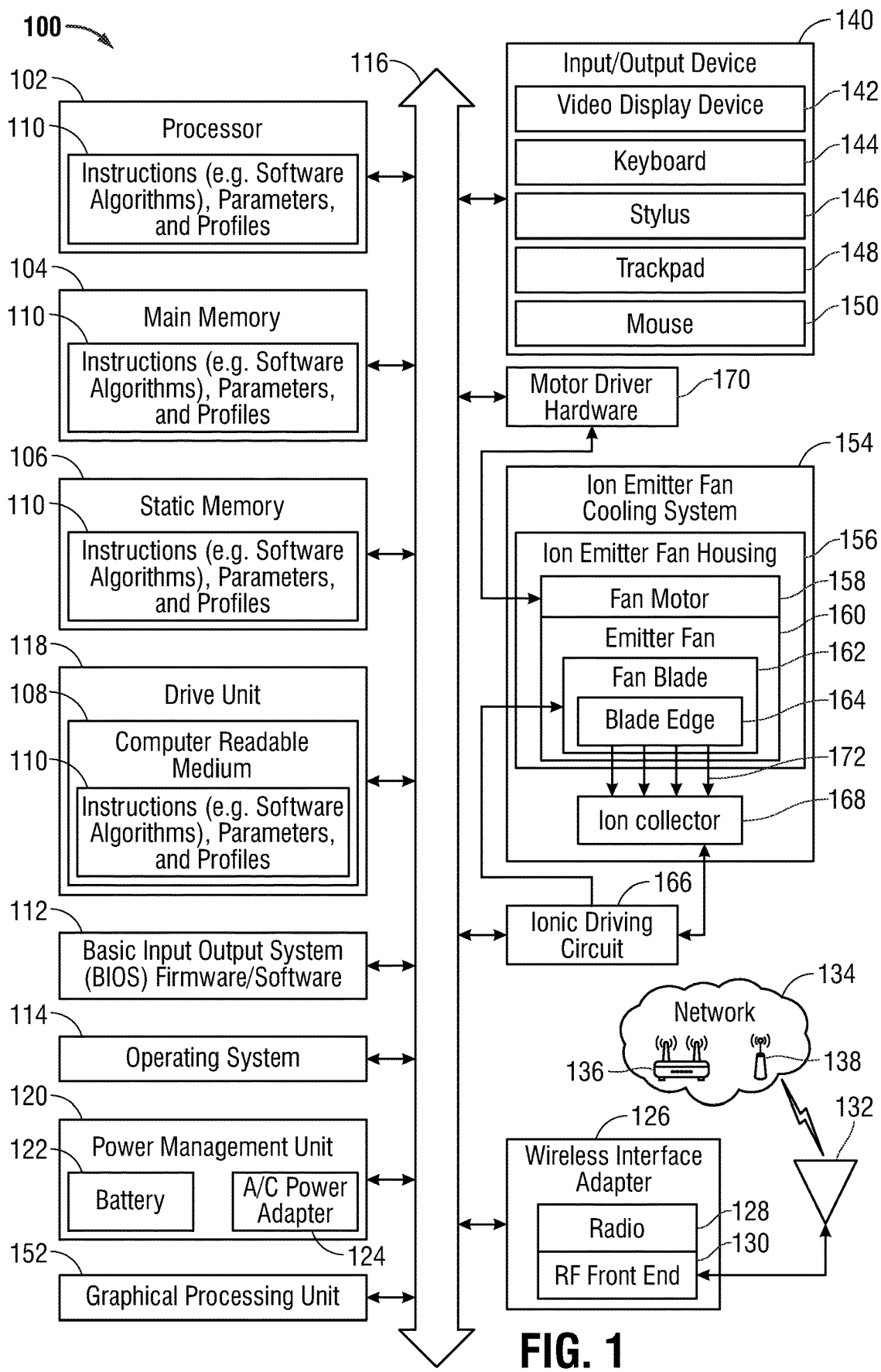
FIG. 1 is a block diagram of an information handling system including a cooling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Information handling systems operate to provide computing, data storage, and application resources among other computing resources. The hardware used to provide these resources to the user consume electricity. As a result of the consumption of this electricity, heat is produced within the housing or other structures used to house the hardware. Some information handling systems include a fan used to blow heat from within the housing to a vent to vent the heated air from within the housing. However, these fans may create a higher degree of noise that may interfere with the use of the information handling system especially when the fan speed is increased due to increased power consumption and a resulting increase in temperature within the housing.

The present specification describes a rotating blade system operative coupled to or integrated with an ionic driving circuit for an ionic emitter air movement system. The rotating blade system may act as a fan, called an ion emitter fan herein, that is operatively coupled to a fan motor to rotate the emitter fan blades. The ionic driving circuit may be operatively coupled to the emitter fan and include a high voltage source that causes the creation of ions by the ion emitter fan within the housing of the ion emitter fan cooling system. An ion collector may be positioned near a vent formed on the housing of the information handling system to draw the ions created by the ion emitter fan towards the vent in order to create an airflow from with the housing of the ion emitter fan housing and the housing of the information handling system.

In an embodiment, an information handling system includes a processor, a memory device, and a power management unit (PMU) to process data stored and the memory device using power provided by the PMU. As described herein, these functions may create heat within the housing of the information handling system. The information handling system further includes an ion emitter fan cooling system including an ion emitter fan housed within an ion emitter fan housing that includes a plurality of emitter fan blades. These plurality of emitter fan blades may include blade edges that form a pointed surface thereon to act as emitter surface for an ion emitter according to embodiments herein. The plurality of emitter fan blades may be operatively coupled to an ionic driving circuit.

The ionic driving circuit causes electrons to be stripped from gas atoms located at the blade edges of the plurality of emitter fan blades to ionize gases within the ion emitter fan housing and create charged ions (e.g., cations) to create an airflow out of an external opening of the ion emitter fan housing. This process may include providing an ion collector formed at a vent of the ion emitter fan housing and generating airflow by a shearing or pulling force of the ions on surrounding air due to the electromagnetic attraction at the ion collector (e.g., ion collector is an anode of the ionic driving circuit). This movement of the created ions by the emitter fan blades of the ion emitter fan produces a dragging or shearing force of the surrounding air to generate the airflow from the ion emitter fan to the ion collector in an embodiment. In an embodiment, this ionic airflow may supplement the airflow created by the movement of the emitter fan blades of the ion emitter fan. As a result, the ion emitter fan may create airflow via both rotation of the blades by the fan motor as well as creation of these negatively-charged ions within the ion emitter fan housing. This reduces the noise created by the movement of the emitter fan blades by, potentially, reducing the necessary speed of the emitter fan blades to extract the heated air from within the housing of the information handling system.

In an embodiment, the ion collector is formed at the external opening of the ion emitter fan housing to provide a deionization source for the ionized gases formed by the emission of electrons from the blade edges of the plurality of emitter fan blades. In an embodiment, the ion collector is operatively coupled to the ionic driving circuit to create an attractive force to attracts the ionized gas towards the ion collector and thus moves the air to the ion collector. Because, in an embodiment, the ion collector and ion emitter fan are operatively coupled to the ionic driving circuit, those ions are created at the emitter fan blades and attracted, via the electromagnetic force, to the ion collector creating the airflow described herein. In an embodiment, the ion collector includes a plurality of thermal fins to dissipate heat from the airflow movement through the thermal fins created by the attractive movement of the ionized gas as well as deionize the gases ionized by the ion emitter fan.

The ionic driving circuit may be operatively coupled to the ion emitter fan such that the fan motor is not affected by the high voltage source of the ionic driving circuit. In an embodiment, the ion emitter fan is operatively coupled to the fan motor via an electrical isolation hub. The electrical isolation hub also isolates that hardware of the fan motor from the high voltages of the ionic driving circuit via the ion emitter fan.

FIG. 1 illustrates an information handling system 100 similar to information handling systems according to several aspects of the present disclosure that is operatively couplable to a cooling system formed within a housing of the information handling system. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a convertible laptop, a tablet, a smartphone, a communications device, an access point (AP), a base station transceiver, a wireless telephone, a control system, a camera, a scanner, a printer, a personal trusted device, a web appliance, or any other suitable machine capable of executing a set of instructions (sequential or otherwise) that specify actions to be taken by that machine, and can vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the computer system 100 can be implemented using electronic devices that provide voice, video, or data communication. For example, an information handling system 100 may be any mobile or other computing device capable of executing a set of instructions (sequential or otherwise) that specify actions to be taken by that machine. In an embodiment, the information handling system 100 may be operatively coupled to a server or other network device as well as with any wireless peripheral devices. Further, while a single information handling system 100 is illustrated, the term "system" shall also be taken to include any collection of systems or sub-systems that individually or jointly execute a set, or multiple sets, of instructions to perform one or more computer functions.

The information handling system 100 may include memory (volatile (e.g., random-access memory, etc.), non-volatile (read-only memory, flash memory etc.) or any combination thereof), one or more hardware processing resources, such as a central processing unit (CPU), a graphics processing unit (GPU) 152, processing, hardware, controller, or any combination thereof. Additional components of the information handling system 100 can include one or more storage devices, one or more communications ports for communicating with external devices, as well as various input and output (I/O) devices 140, such as a keyboard 144, a mouse 150, a video display device 142, a stylus 146, a trackpad 148, or any combination thereof. The information handling system 100 can also include one or more buses 116 operable to transmit data communications between the various hardware components described herein. Portions of an information handling system 100 may themselves be considered information handling systems and some or all of which may be wireless.

Information handling system 100 can include devices or modules that embody one or more of the devices or execute instructions for the one or more systems and modules described above, and operates to perform one or more of the methods described herein. For example, code instructions may be executed by a PMU controller or other hardware processing resource for an ionic emitter fan control system to control the ionic emitter fan cooling system 154 of embodiments herein. The information handling system 100 may execute code instructions 110 via processing resources that may operate on servers or systems, remote data centers, or on-box in individual client information handling systems according to various embodiments herein. In some embodiments, it is understood any or all portions of code instructions 110 may operate on a plurality of information handling systems 100.

The information handling system 100 may include hardware processing resources such as a processor 102, a central processing unit (CPU), accelerated processing unit (APU), a neural processing unit (NPU), a vision processing unit (VPU), an embedded controller (EC), a digital signal processor (DSP), a GPU 152, a microcontroller, or any other type of hardware processing device that executes code instructions to perform the processes described herein. Any of the hardware processing resources may operate to execute code that is either firmware or software code. Moreover, the information handling system 100 can include memory such as main memory 104, static memory 106, computer readable medium 108 storing instructions 110 of, in an example embodiment, an ion emitter fan control system (e.g., controlled by a power management unit (PMU) controller), or other computer executable program code, and drive unit 118 (volatile (e.g., random-access memory, etc.), nonvolatile (read-only memory, flash memory etc.) or any combination thereof).

As shown, the information handling system 100 may further include a video display device 142. The video display device 142, in an embodiment, may function as a liquid crystal display (LCD), an organic light emitting diode (OLED), a flat panel display, or a solid-state display. Although FIG. 1 shows a single video display device 142, the present specification contemplates that multiple video display devices 142 may be used with the information handling system to facilitate an extended desktop scenario, for example. Additionally, the information handling system 100 may include one or more input/output devices 140 including an alpha numeric input device such as a keyboard 144 and/or a cursor control device, such as a mouse 150, touchpad/trackpad 148, a stylus 146, or a gesture or touch screen input device associated with the video display device 142 that allow a user to interact with the images, windows, and applications presented to the user. In an embodiment, the video display device 142 may provide output to a user that includes, for example, one or more windows describing one or more instances of applications being executed by the processor 102 of the information handling system. In this example embodiment, a window may be presented to the user that provides a graphical user interface (GUI) representing the execution of that application.

The network interface device of the information handling system 100 shown as wireless interface adapter 126 can provide connectivity among devices such as with Bluetooth® or to a network 134, e.g., a wide area network (WAN), a local area network (LAN), wireless local area network (WLAN), a wireless personal area network (WPAN), a wireless wide area network (WWAN), or other network. In an embodiment, the WAN, WWAN, LAN, and WLAN may each include an access point 136 or base station 138 used to operatively couple the information handling system 100 to a network 134. In a specific embodiment, the network 134 may include macro-cellular connections via one or more base stations 138 or a wireless access point 136 (e.g., Wi-Fi or WiGig), or such as through licensed or unlicensed WWAN small cell base stations 138. Connectivity may be via wired or wireless connection. For example, wireless network access points 136 or base stations 138 may be operatively connected to the information handling system 100. Wireless interface adapter 126 may include one or more radio frequency (RF) subsystems (e.g., radio 128) with transmitter/receiver circuitry, modem circuitry, one or more antenna front end circuits 130, one or more wireless controller circuits, amplifiers, antennas 132 and other circuitry of the radio 128 such as one or more antenna ports used for wireless communications via multiple radio access technologies (RATs). The radio 128 may communicate with one or more wireless technology protocols. In and embodiment, the radio 128 may contain individual subscriber identity module (SIM) profiles for each technology service provider and their available protocols for any operating subscriber-based radio access technologies such as cellular LTE communications.

In an example embodiment, the wireless interface adapter 126, radio 128, and antenna 132 may provide connectivity to one or more of the peripheral devices that may include a wireless video display device 142, a wireless keyboard 144, a wireless mouse 150, a wireless headset, a microphone, a wireless stylus 146, and a wireless trackpad 148, among other wireless peripheral devices used as input/output (I/O) devices 140.

The wireless interface adapter 126 may include any number of antennas 132 which may include any number of tunable antennas for use with the system and methods disclosed herein. Although FIG. 1 shows a single antenna 132, the present specification contemplates that the number of antennas 132 may include more or less of the number of individual antennas shown in FIG. 1. Additional antenna system modification circuitry (not shown) may also be included with the wireless interface adapter 126 to implement coexistence control measures via an antenna controller in various embodiments of the present disclosure.

In some aspects of the present disclosure, the wireless interface adapter 126 may operate two or more wireless links. In an embodiment, the wireless interface adapter 126 may operate a Bluetooth® wireless link using a Bluetooth® wireless or Bluetooth® Low Energy (BLE). In an embodiment, the Bluetooth® wireless protocol may operate at frequencies between 2.402 to 2.48 GHz. Other Bluetooth® operating frequencies such as Bluetooth® operating frequencies such as 6 GHz are also contemplated in the presented description. In an embodiment, a Bluetooth® wireless link may be used to wirelessly couple the input/output devices operatively and wirelessly including the mouse 150, keyboard 144, stylus 146, trackpad 148, and/or video display device 142 to the bus 116 in order for these devices to operate wirelessly with the information handling system 100. In a further aspect, the wireless interface adapter 126 may operate the two or more wireless links with a single, shared communication frequency band such as with the 5G or Wi-Fi WLAN standards relating to unlicensed wireless spectrum for small cell 5G operation or for unlicensed Wi-Fi WLAN operation in an example aspect. For example, a 2.4 GHz/2.5 GHz or 5 GHz wireless communication frequency bands may be apportioned under the 5G standards for communication on either small cell WWAN wireless link operation or Wi-Fi WLAN operation. In some embodiments, the shared, wireless communication band may be transmitted through one or a plurality of antennas 132 may be capable of operating at a variety of frequency bands. In an embodiment described herein, the shared, wireless communication band may be transmitted through a plurality of antennas used to operate in an N×N MIMO array configuration where multiple antennas 132 are used to exploit multipath propagation which may be any variable N. For example, N may equal 2, 3, or 4 to be 2×2, 3×3, or 4×4 MIMO operation in some embodiments. Other communication frequency bands, channels, and transception arrangements are contemplated for use with the embodiments of the present disclosure as well and the present specification contemplates the use of a variety of communication frequency bands.

The wireless interface adapter 126 may operate in accordance with any wireless data communication standards. To communicate with a wireless local area network, standards including IEEE 802.11 WLAN standards (e.g., IEEE 802.11ax-2021 (Wi-Fi 6E, 6 GHz)), IEEE 802.15 WPAN standards, WWAN such as 3GPP or 3GPP2, Bluetooth®standards, or similar wireless standards may be used. Wireless interface adapter 126 may connect to any combination of macro-cellular wireless connections including 2G, 2.5G, 3G, 4G, 5G or the like from one or more service providers.

Utilization of radio frequency communication bands according to several example embodiments of the present disclosure may include bands used with the WLAN standards and WWAN carriers which may operate in both licensed and unlicensed spectrums. For example, both WLAN and WWAN may use the Unlicensed National Information Infrastructure (U-NII) band which typically operates in the −5 MHz frequency band such as 802.11 a/h/j/n/ac/ax (e.g., center frequencies between 5.170-7.125 GHz). WLAN, for example, may operate at a 2.4 GHz band, 5 GHz band, and/or a 6 GHz band according to, for example, Wi-Fi, Wi-Fi 6, or Wi-Fi 6E standards. WWAN may operate in a number of bands, some of which are proprietary but may include a wireless communication frequency band. For example, low-band 5G may operate at frequencies similar to 4G standards at 600-850 MHz. Mid-band 5G may operate at frequencies between 2.5 and 3.7 GHz. Additionally, high-band 5G frequencies may operate at 25 to 39 GHz and even higher. In additional examples, WWAN carrier licensed bands may operate at the new radio frequency range 1 (NRFR1), NFRF2, bands, and other known bands. Each of these frequencies used to communicate over the network 134 may be based on the radio access network (RAN) standards that implement, for example, eNodeB or gNodeB hardware connected to mobile phone networks (e.g., cellular networks) used to communicate with the information handling system 100. In the example embodiment, the information handling system 100 may also include both unlicensed wireless RF communication capabilities as well as licensed wireless RF communication capabilities. For example, licensed wireless RF communication capabilities may be available via a subscriber carrier wireless service operating the cellular networks. With the licensed wireless RF communication capability, a WWAN RF front end (e.g., antenna front end 130 circuits) of the information handling system 100 may operate on a licensed WWAN wireless radio with authorization for subscriber access to a wireless service provider on a carrier licensed frequency band.

In other aspects, the information handling system 100 operating as a mobile information handling system may operate a plurality of wireless interface adapters 126 for concurrent radio operation in one or more wireless communication bands. The plurality of wireless interface adapters 126 may further share a wireless communication band or operate in nearby wireless communication bands in some embodiments. Further, harmonics and other effects may impact wireless link operation when a plurality of wireless links are operating concurrently as in some of the presently described embodiments.

The wireless interface adapter 126 can represent an add-in card, wireless network interface module that is integrated with a main board of the information handling system 100 or integrated with another wireless network interface capability, or any combination thereof. In an embodiment the wireless interface adapter 126 may include one or more radio frequency subsystems including transmitters and wireless controllers for connecting via a multitude of wireless links. In an example embodiment, an information handling system 100 may have an antenna system transmitter for Bluetooth®, BLE, 5G small cell WWAN, or Wi-Fi WLAN connectivity and one or more additional antenna system transmitters for macro-cellular communication. The RF subsystems and radios 128 and include wireless controllers to manage authentication, connectivity, communications, power levels for transmission, buffering, error correction, baseband processing, and other functions of the wireless interface adapter 126.

As described herein, the information handling system 100 may include and be operatively coupled to an ion emitter fan cooling system 154. The ion emitter fan cooling system 154 may be coupled within a housing of the information handling system 100 in an embodiment so that heat generated by the operation of the hardware (e.g., processor 102, memory devices 104, 106, PMU 120, etc.) may be directed out of the housing of the information handling system 100 via a heat vent formed in the housing. The ion emitter fan cooling system 154 may include an ion emitter fan housing 156 used to house the components of the ion emitter fan cooling system 154 described herein in an embodiment. In an alternative embodiment, the ion emitter fan cooling system 154 does not include an ion emitter fan housing 156 and instead, those components of the ion emitter fan cooling system 154 are operatively coupled to the housing of the information handling system 100. For ease of discussion, the ion emitter fan cooling system 154 will be described as including the ion emitter fan housing 156 which allows the ion emitter fan cooling system 154 to be modular and replaced if necessary.

The ion emitter fan cooling system 154 includes an ion emitter fan 160. The ion emitter fan 160 may include a plurality of emitter fan blades 162 used to create an airflow out of the ion emitter fan housing 156. The number of blades may vary depending on an anticipated level of heat generation by the hardware within the information handling system 100, and the shape and design of the ion emitter fan housing 156 or housing of the information handling system 100, among other factors. Each of the emitter fan blades 162 are coupled to each other at a central hub in an embodiment. In an embodiment, each of the emitter fan blades 162 includes a blade edge 164. The blade edges 164 may terminate at a shape point such as a knife-like edge. In one embodiment, the blade edges 164 may be made to come to the sharpest point possible in order to facilitate the creation of more ions. In an embodiment, the ion emitter fan 160 and the emitter fan blades 162 may be made of a refractory metal such as niobium, chromium, molybdenum, tantalum, tungsten, and rhenium among others. In an embodiment, the portions of the ion emitter fan 160 and emitter fan blades 162 may be electroplated with a refractory metal such as niobium, chromium, molybdenum, tantalum, tungsten, and rhenium among others with an interior layer of the ion emitter fan 160 and emitter fan blades 162 being made of a conductive material such as iron. It is appreciated that the ion emitter fan 160 and emitter fan blades 162 may be made of any alloy of metal that includes alloys of those refractory metals described herein.

The ion emitter fan 160 may be operatively coupled to a fan motor 158 used to drive the ion emitter fan 160 causing the ion emitter fan 160 to rotate within the ion emitter fan housing 156. In an embodiment, the fan motor 158 is operatively coupled to motor driver hardware 170. The motor driver hardware 170 may include various circuits used to control the fan motor 158. In an embodiment, the motor driver hardware 170 is operatively coupled to the processor 102 to control the operation of the motor driver hardware 170 and fan motor 158. The rotation of the ion emitter fan 160 may create an airflow within the ion emitter fan housing 156 as described herein. In an embodiment, the central emitter hub of the emitter fan blade 162 may be coupled to an electrically insulative hub coupled to a drive shaft of the fan motor 158. The electrically insulative hub electrically isolates the hardware of the fan motor 158 from the electrically conductive emitter fan blades 162 and hub of the ion emitter fan 160. As will be described herein, the ion emitter fan 160 and a collector 168 are electrically coupled to a high voltage source (e.g., 2 kV to 10 kV voltage source difference between the ion emitter fan 160 and the ion collector 168) and the electrically insulative hub of the fan motor 158 prevents the fan motor 158 from being subjected to these high voltages.

The ion emitter fan 160 may be operatively coupled to an ionic driving circuit 166. In an embodiment, the ionic driving circuit 166 is controlled via the processor 102, the PMU 120 with a hardware controller, or both. The ionic driving circuit 166, in an embodiment, includes a high voltage source that is operatively coupled to the ion emitter fan 160. In an embodiment, the high voltage source may include a boost converter that steps up voltage from its input (e.g., a battery 122 or A/C power adapter 124) to the output at the ion emitter fan 160 and/or ion collector 168. As described herein, this high voltage source is electrically insulated from the fan motor 158 driving the ion emitter fan 160 via the electrically insulative hub. The high voltage source of the ionic driving circuit 166 causes the ion emitter fan 160 to emit ions 172 from the blade edges 164 of each emitter fan blade 162. In the context of the present specification, the term "emit" or "emitter" is meant to describe an action and device that, at its edges or other surfaces, creates ions 172 and, via an electromagnetic repulsion, repels those ions towards an attracting, oppositely charged source such as the ion collector 168 described herein. In an embodiment, the high voltage source of the ionic driving circuit 166 causes electrons to be ripped away from certain atoms such as gas atoms in the atmosphere thereby creating ions (e.g., positively-charged ions) at the edges or other surfaces of the emitter fan blades 162. This ionization process may include the removal of one or more electrons from the outer valence shells of the individual atoms within the gas such that they become positively charged (e.g., cations) in an embodiment. In an example where the interior of the ion emitter fan housing 156 includes atmospheric air, any number of types of gas atoms may be subjected to this process. For example, where the gas includes oxygen (O), the ionization of oxygen may include a free electron source to force the removal of a single electron or two electrons from the oxygen molecule or atom. This may lead to a $O^+$ or $O^{2+}$ ion (e.g., cation) being created by the ion emitter fan 160 and ionic driving circuit 166 in an embodiment. Other gas atoms or molecules within the atmosphere within the ion emitter fan housing 156 may similarly be ionized such as nitrogen, carbon dioxide, argon, hydrogen, etc. to create other ions such as $N^{+1}$, $N^{+2}$, $N^{+3}$, $N^{+4}$, $N^{+5}$, $O_3$ (ozone), $H^{+1}$.

This ionization of the atmospheric gases within the ion emitter fan housing 156 helps to cause an airflow within the ion emitter fan housing 156 (e.g., into the ion emitter fan housing 156 and out of the ion emitter fan housing 156). In an embodiment, the movement of the ions from the ion emitter fan 160 to the ion collector 168 creates a shearing force on the air (e.g., ionized atoms drag non-ionized atoms) within the ion emitter fan housing 156. This shearing force pulls the other air molecules and atoms in the direction that of the magnetic pull of the ions created by the ion emitter fan 160 and ion collector 168 thereby creating this airflow. In an embodiment, the movement of the ions 172 created and emitted from the ion emitter fan 160 may be from the ion emitter fan 160 to the ion collector 168. In an example embodiment, the ion emitter fan 160 may be operatively coupled to a positive electrode of the high voltage source of the ionic driving circuit 166. As a result of generating the positively charged ions 172, the charged ion emitter fan 160 now repels those positively charged ions 172 causing the charged ions 172 to be repelled away from the ion emitter fan 160, following the electric field created between the ion emitter fan 160 and ion collector 168, and attracted to the ion collector 168.

In an embodiment, the ion collector 168 is operatively coupled to a negative or opposite electrode of the high voltage source of the ionic driving circuit 166. In an embodiment, the ion collector 168 is operatively coupled to a grounding source or high voltage negative source of the ionic driving circuit 166. Whether the ion collector 168 is coupled to a negative electrode of the high voltage source or to ground of the high voltage source between the ion emitter fan 160 and ion collector 168 determines an electric field between the ion emitter fan 160 and the ion collector 168 is created and the ions created by the ion emitter fan 160 follow this electric field. In an embodiment where the ion collector 168 is operatively coupled to a positive electrode of the high voltage source and not ground, the ion collector 168 may be electrically insulated from the remaining portions of the ion emitter fan cooling system 154 including the ion emitter fan housing. In an embodiment, this electrical isolation may be accomplished by making the ion emitter fan housing 156 out of an electrically non-conductive material such as plastic. In an embodiment, the electrical isolation may be accomplished by placing an insulative gasket (not shown) between the ion collector 168 and the ion emitter fan housing. The electrical isolation of the ion collector 168 allows for the electrical field between the ion emitter fan 160 and ion collector 168 to be formed allowing for an electrical field path for the ions to follow. Where the ion collector 168 is operatively coupled to a high voltage source as an anode, for example, the housing of the information handling system 100 may include portions of the housing that prevents a user from touching the ion collector 168 to prevent injury.

In an embodiment, the creation of the electric field between the ion emitter fan 160 and ion collector 168 causes the positively-charged ions 172 created by the ion emitter fan 160 to be attracted to the positively charged ion collector 168 further causing movement of the ions 172 and creating an airflow within the ion emitter fan housing 156 as described. As the positively-charged ions 172 reach the ion collector 168, those missing valence electrons stripped away by the ion emitter fan 160 at the ions 172 by the may be added to a valence shells of the ionized atoms placing those gases at a neutral electrical charge again. Following the example of the ionization of the oxygen atoms in the atmospheric gases within the ion emitter fan housing 156 by the ion emitter fan 160, as these $O^+$ or $O^{2+}$ ions 172 (e.g., cations) have their extraneous electrons returned from at their valence electron shells (e.g., a single electron or two electrons, respectively) the oxygen atoms are placed in an electrically neutral state.

The creation of this airflow via the ionic movement of the ions created by the ion emitter fan 160 has a low-pressure head of around 0.04 to 0.05 inches of $H_2O$ (water column) as compared to the rotation of the ion emitter fan 160 by the activation of the motor driver hardware 170 and fan motor 158 having a pressure head of around 0.5 inches of $H_2O$. However, the flow rate of air into and out of the ion emitter fan cooling system 154 via operation of the ion emitter fan 160 and ion collector 168 creating ions is relatively higher than the potential flow rate of air created by the rotation of the ion emitter fan 160. For purposes of the present specification, the term "pressure head" is defined as the height of a fluid (e.g., air, water or other fluids) column that corresponds to a particular pressure exerted by the fluid column corresponding to pressure or psi of airflow created by the ionization of air and/or the rotation of the ion emitter fan 160. By imparting relatively high airflow rate with lower pressure head, the acoustics of the ion emitter fan cooling system 154 are reduced in an embodiment.

In an embodiment, the airflow created by this movement of the ions 172 may supplement the airflow created via the rotation of the ion emitter fan 160 by the fan motor 158. As such, in an embodiment, the rotation of the ion emitter fan 160 may be reduced in speed or stopped as compared to other fans that do not operate as ion emitter fans 160 in other information handling system. Because the movement of the ions 172 creates an airflow, in some embodiments the rotation of the ion emitter fan 160 may be stopped allowing the cooling of the hardware within the housing of the information handling system 100 by the ion emitter fan cooling system 154 to be accomplished via the airflow created by the creation of the ions 172 by the ion emitter fan 160. In some embodiments where the heat of the hardware within the housing of the information handling system 100 increases, the processor 102 may direct the motor driver hardware 170 to drive the fan motor 158 to turn the ion emitter fan 160 so that the additional airflow created by the rotation of the emitter fan blades 162 may increase the speed of the airflow further. This allows the noises associated with the rotation of the ion emitter fan 160 to be reduced or even eliminated during relatively cool temperatures within the housing of the information handling system 100 thereby decreasing the noise heard by the user of the information handling system 100. As a result, in an embodiment, the ion emitter fan cooling system 154 described herein may have a noiseless base capability of cooling the information handling system 100 with a backup cooling system via actuation of the fan motor 158 to rotate the emitter fan blades 162 as described herein. This may further increase the user satisfaction of the information handling system 100 during operation of the information handling system 100 by decreasing fan noise heard by the user.

It is appreciated that a positive electrode of the high voltage source of the ionic driving circuit 166 may be operatively coupled to the ion emitter fan 160 with the negative electrode of the high voltage source operatively coupled to the ion collector 168. In this example embodiment, the ion emitter fan 160 may strip electrons from the gas atoms creating a positively-charged ion 172 (e.g., cation). Again, in the example where an oxygen atom interacts with the ion emitter fan 160, the ion emitter fan 160 may act as a free electron source to remove one or two electrons from the valence electron shell of the oxygen atom thereby creating a $O^+$ or $O^{2+}$ cation of oxygen. Because these cations are now positively charged, they are concurrently repelled from the ion emitter fan 160 (e.g., acting as the anode) and attracted to the ion collector 168 acting as a cathode. This movement of the ions 172 creates an airflow within the ion emitter fan housing 156 as described herein thereby allow heated air to be expelled from within the housing of the information handling system 100.

In an embodiment, the ion collector 168 may include one or more thermal fins. These thermal fins may be used to deionize those gases that where ionized by the ion emitter fan 160 as well as serve as a heat sink for the heat from the air to be dissipated. In an embodiment, other thermal fins may be included with or near the ion collector 168 to help dissipate the heat and may form part of the ion emitter fan cooling system 154 described herein.

In an embodiment, the ion emitter fan housing 156 may include an air intake hole formed parallel to the rotational axis of the ion emitter fan 160 so that air from within the housing of the information handling system 100 may be pulled into the ion emitter fan housing 156. An air outlet hole may be formed into the ion emitter fan housing 156 that is perpendicular to the rotational axis of the ion emitter fan 160 to allow air to be expelled out from the ion emitter fan housing 156 and the housing of the information handling system 100. In an embodiment, the ion emitter fan cooling system 154 may be operatively and thermally coupled to other cooling system hardware within the housing of the information handling system 100 such as a heat pipe, vapor chamber, among other thermal conductive materials and devices. A vapor chamber, in an example embodiment, may include a tubular and sealed pipe with a working fluid therein. As the vapor chamber receives heat from a source such as a heat producing component such as a processor, radio module, or power system/battery, the working fluid may absorb that heat and move from one state to another (e.g., liquid state into a gas state) as the temperature changes. Heat received in the vapor chamber may be dumped at the second heat conductive element placed at or near the intake hole of the ion emitter fan housing 156.

The information handling system 100 can include one or more set of instructions 110 that can be executed to cause the computer system to perform any one or more of the methods or computer-based functions disclosed herein. For example, instructions 110 may execute various software applications, software agents, a basic input/output system (BIOS) 112 firmware and/or software, or other aspects or components. Instructions 110 may execute an ionic emitter fan control system to control various aspects of the ionic emitter fan cooling system 154 of the embodiments herein. Various software modules comprising application instructions 110 may be coordinated by an operating system (OS) 114, and/or via an application programming interface (API). An example OS 114 may include Windows®, Android®, and other OS types known in the art. Example APIs may include Win 32, Core Java API, or Android APIs.

The disk drive unit 118 and may include a computer-readable medium 108 in which one or more sets of instructions 110 such as software can be embedded to be executed by the processor 102 or other processing devices such as a GPU 152 to perform the processes described herein. Similarly, main memory 104 and static memory 106 may also contain a computer-readable medium for storage of one or more sets of instructions, parameters, or profiles 110 described herein. The disk drive unit 118 or static memory 106 also contain space for data storage. Further, the instructions 110 may embody one or more of the methods as described herein. In a particular embodiment, the instructions, parameters, and profiles 110 may reside completely, or at least partially, within the main memory 104, the static memory 106, and/or within the disk drive 118 during execution by the processor 102 or GPU 152 of information handling system 100. The main memory 104, GPU 152, and the processor 102 also may include computer-readable media.

Main memory 104 or other memory of the embodiments described herein may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The applications and associated APIs, for example, may be stored in static memory 106 or on the drive unit 118 that may include access to a computer-readable medium 108 such as a magnetic disk or flash memory in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In an embodiment, the information handling system 100 may further include a power management unit (PMU) 120 (a.k.a. a power supply unit (PSU)). The PMU 120 may include a hardware controller and executable code instructions to manage the power provided to the components of the information handling system 100 such as the hardware processor 102, and manage control of the ion emitter fan 160, the ion emitter fan cooling system 154 that includes the fan motor 158, ionic driving circuit 166, and motor driver hardware 170. The PMU 120 may control power to one or more components including the ion emitter fan 160, ionic driving circuit 166, one or more drive units 118, the hardware processor 102 (e.g., CPU), the GPU 152, a video/graphic display device 142 or other input/output devices 140 such as the stylus 146, a mouse 150, a keyboard 144, and a trackpad 148 and other components that may require power when a power button has been actuated by a user. In an embodiment, the PMU 120 may monitor power levels or temperature via thermistors and be electrically coupled, either wired or wirelessly, to the information handling system 100 to provide this power and coupled to bus 116 to provide or receive data or instructions. The PMU 120 may regulate power from a power source such as a battery 122 or A/C power adapter 124. In an embodiment, the battery 122 may be charged via the A/C power adapter 124 and provide power to the components of the information handling system 100 via a wired connections as applicable, or when A/C power from the A/C power adapter 124 is removed. PMU 120 may include a hardware controller to execute code instructions 110 of an ionic emitter fan control system to control the ionic emitter and fan rotation of the ionic emitter fan cooling system 154 based on detected temperature thresholds according to embodiments of the present disclosure.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In other embodiments, dedicated hardware implementations such as application specific integrated circuits (ASICs), programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

When referred to as a "system," a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module can include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module can also include a combination of the foregoing examples of hardware or software. Note that an information handling system can include an integrated circuit or a board-level product having portions thereof that can also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another can communicate directly or indirectly through one or more intermediaries.

Figure 2:
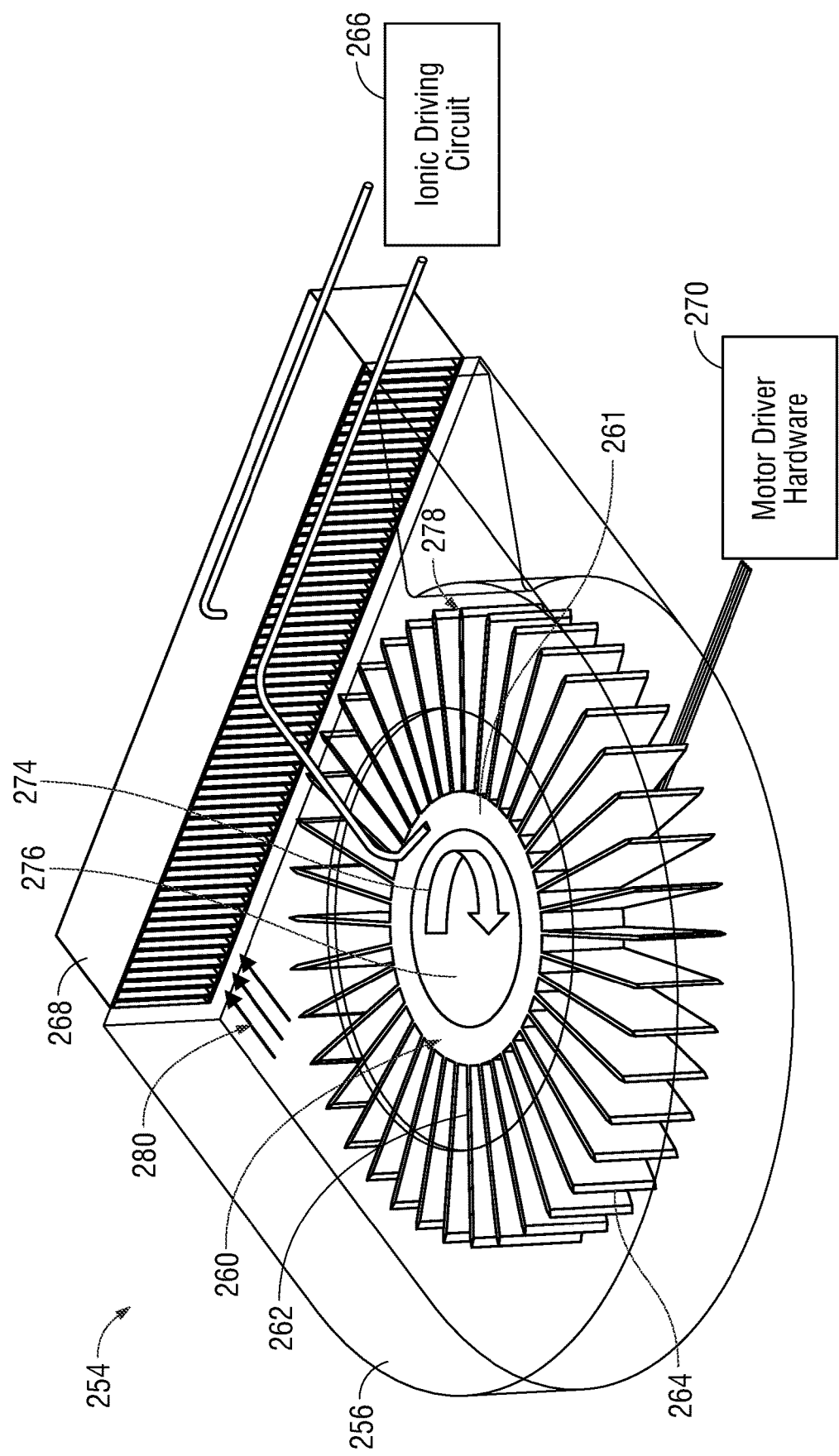
FIG. 2 is a graphic diagram perspective view of ion emitter fan cooling system of an information handling system according to an embodiment of the present disclosure.
Figure 5:
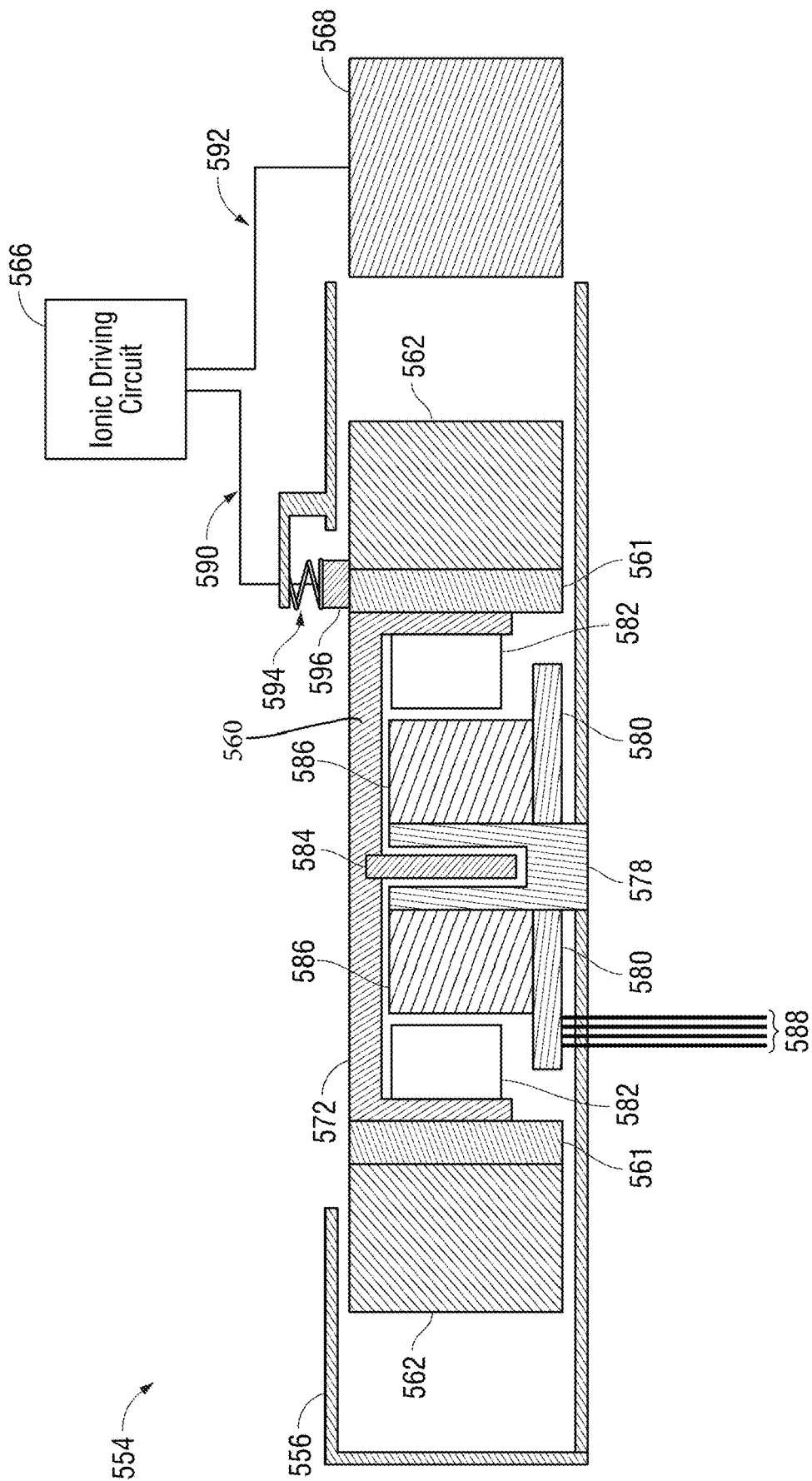
FIG. 5 is a graphic, cross-sectional diagram of an ion emitter fan cooling system according to an embodiment of the present disclosure.

FIG. 2 is a graphic diagram of an ion emitter fan cooling system 254 of an information handling system according to an embodiment of the present disclosure. As described herein, the ion emitter fan cooling system 254 may be a modular ion emitter fan cooling system 254 that may be inserted into a portion of the housing of the information handling system and placed next to and/or operatively coupled to other active or passive cooling systems within the information handling system such as a heat pipe, a vapor chamber, and a heat sink, other fans, among other hardware. FIG. 2 also includes line "A" indicating a cross-sectional line where a side, cross-sectional view of the ion emitter fan cooling system 254 is shown in FIG. 5.

The ion emitter fan cooling system 254 may include an ion emitter fan housing 256 used to house the components of the ion emitter fan cooling system 254 described herein in an embodiment. In the embodiment shown in FIG. 2, the shape of the ion emitter fan housing 256 may conform, along a portion of a sidewall of the ion emitter fan housing 256, with a radius of the ion emitter fan 260. A portion of the sidewall of the ion emitter fan housing 256 may abut an ion collector 268 and may be sized to allow a sufficient amount of airflow out of the ion emitter fan housing 256. It is appreciated that the shape and size of the ion emitter fan housing 256 may be varied depending on available space within the housing of the information handling system, the shape of the space within the information handling system, and the amount of airflow needed to cool the hardware components within the information handling system, among other considerations. As described herein, in an embodiment, the ion emitter fan housing 256 may be made of an electrically non-conductive material such as a plastic in order to allow the electric fields created between the ion emitter fan 260 and ion collector 268 to be created and ions to pass from the ion emitter fan 260 towards the ion collector 268. In an embodiment, the ion emitter fan housing 256 is made out of an electrically non-conductive material such as plastic. In another embodiment, an insulative gasket (not shown) may be formed between the ion collector 268 and the ion emitter fan housing 258. The electrical isolation of the ion collector 268 allows for the electrical field between the ion emitter fan 260 and ion collector 268 to be formed allowing for an electrical field path for the ions to follow. Where the ion collector 268 is operatively coupled to a high voltage source via, for example, a negative electrode of, the housing of the information handling system may include portions of the housing that prevent a user from touching the ion collector 268 to prevent injury or interference.

As described in embodiments herein, the ion emitter fan cooling system 254 includes an ion emitter fan 260. The ion emitter fan 260 may include a plurality of emitter fan blades 262 used to create an airflow 280 out of the ion emitter fan housing 256. The number of emitter fan blades 262 may vary depending on an anticipated level of heat generation by the hardware within the information handling system, and the shape and design of the ion emitter fan 260, the ion emitter fan housing 256 or housing of the information handling system, among other factors. Each of the emitter fan blades 262 are coupled to each other at a conductive central emitter fan hub 261 in an embodiment. In an embodiment, each of the emitter fan blades 262 includes a blade edge 264. The blade edges 264 may terminate at a shape point such as a knife-like edge. In an embodiment, the ion emitter fan 260 and the emitter fan blades 262 may be made of a refractory metal such as niobium, chromium, molybdenum, tantalum, tungsten, and rhenium among others. In an embodiment, the portions of the ion emitter fan 260 and emitter fan blades 262 may be electroplated with a refractory metal such as niobium, chromium, molybdenum, tantalum, tungsten, and rhenium among others with an interior layer of the ion emitter fan 260 and emitter fan blades 262 being made of a conductive material such as iron. It is appreciated that the ion emitter fan 260 and emitter fan blades 262 may be made of any alloy of metal that includes alloys of those refractory metals described herein.

The ion emitter fan 260 may be operatively coupled to a fan motor (not shown but placed under the ion emitter fan 260 and within the electrically insulating inner fan hub 276) used to drive the ion emitter fan 260 causing the ion emitter fan 260 to rotate (e.g., clockwise as indicated by ion emitter fan direction arrow 274 in the shown example embodiment) within the ion emitter fan housing 256. In an embodiment, the fan motor is operatively coupled to motor driver hardware 270 via a number of electrical leads. The motor driver hardware 270 may include various circuits used to control the fan motor and increase or decrease the speed of the rotation of the ion emitter fan 260 based on changes in temperature detected within the housing of the information handling system. In an embodiment, the motor driver hardware 270 is operatively coupled to a processing device used to control the operation of the motor driver hardware 270 and fan motor. The rotation of the ion emitter fan 260 may create an airflow 280 within the ion emitter fan housing 256 as described herein. In an embodiment, the conductive central emitter fan hub 261 of the emitter fan blade 262 may be coupled to an electrically insulating inner fan hub 276 coupled to a drive shaft of the fan motor (not shown). The electrically insulating inner fan hub 276 electrically isolates the hardware of the fan motor from the electrically conductive emitter fan blades 262 and conductive central emitter fan hub 261 of the ion emitter fan 260. As will be described herein, the ion emitter fan 260 is electrically coupled to a high voltage source and the electrically insulating inner fan hub 276 of the fan motor prevents the fan motor from being subjected to these high voltages.

The ion emitter fan 260 may be operatively coupled to an ionic driving circuit 266. In an embodiment, the ionic driving circuit 266 is controlled via the processing device, a PMU, or both. The ionic driving circuit 266, in an embodiment, includes a high voltage source that is operatively coupled to the ion emitter fan 260 at, for example, a float surface at the conductive central emitter fan hub 261 of the ion emitter fan 260 via a brush connection for example. As described herein, this high voltage source for the emitter at the ion emitter fan 160 is electrically insulated from the fan motor driving the ion emitter fan 260 via the electrically insulating inner fan hub 276. The high voltage source of the ionic driving circuit 266 causes the ion emitter fan 260 to emit ions from the blade edges 264 of each emitter fan blade 262. In the context of the present specification, the term "emit" or "emitter" is meant to describe an action and device that, at its edges, creates ions and, via an electromagnetic repulsion, repels those ions towards an oppositely charged source such as the ion collector 268 described herein. In an embodiment, the high voltage source of the ionic driving circuit 266 causes electrons to be ripped away from certain atoms such as gas atoms in the atmosphere thereby creating ions (e.g., positively charged ions) at the edges or other surfaces of the emitter fan blades 262. This ionization process may include the removal of one or more electrons from the outer valence shells of the individual atoms within the gas such that they become positively charged (e.g., cation) in one embodiment. In an example where the interior of the ion emitter fan housing 256 includes atmospheric air, any number of types of gas atoms may be subjected to this process. For example, where the gas includes oxygen (O), the ionization of oxygen may include the removal of a single electron or two electrons from the oxygen. This may lead to a $O^+$ or $O^{2+}$ ion (e.g., cation) being created by the ion emitter fan 160 and ionic driving circuit 166 in an embodiment. Other gas atoms or molecules within the atmosphere within the ion emitter fan housing 156 may similarly be ionized such as nitrogen, carbon dioxide, argon, hydrogen, etc.

This ionization of the atmospheric gases within the ion emitter fan housing 256 helps to cause an airflow 280 to be created. In an embodiment, the movement of the ions created and emitted from the ion emitter fan may pass from the ion emitter fan 260 at any part to the ion collector 268. In an example embodiment, the ion emitter fan 260 may be operatively coupled to a positive electrode of the high voltage source of the ionic driving circuit 266. As a result of creating the positively charged ions 276 at the blade edges 264 of the ion emitter fan 260, the positively charged ion emitter fan 260 now repels those positively charged ions. Additionally, in an embodiment, the ion collector 268 is operatively coupled to a negative electrode of the high voltage source of the ionic driving circuit 266. This causes the positively charged ions created by the ion emitter fan 260 to be attracted to the ion collector 268 further causing movement of the ions and creating an airflow 280 within the ion emitter fan housing 256 as indicated by ion and airflow direction arrows. As the positively-charged ions reach the ion collector 268, those valence electrons removed from the ions 276 by the ion emitter fan 260 may be added to the valence shells placing those gases at a neutral electrical charge again. Following the example of the ionization of the oxygen atoms in the atmospheric gases within the ion emitter fan housing 256 by the ion emitter fan 260, as these $O^+$ or $O^{2+}$ ions (e.g., cations) have electrons added to their valence electron shells (e.g., a single electron or two electrons, respectively) and placed in an electrically neutral state.

In an embodiment, the airflow 280 created by this movement of the ions shearing the air to the ion collector 268 may act as an ionic drag pump that may supplement the airflow created via the rotation of the ion emitter fan 260 by the fan motor. As such, in an embodiment, the rotation of the ion emitter fan 260 may cause air to pass into a top hole 278 formed in the ion emitter fan housing 256. As a result, this may cause the rotational speed of the ion emitter fan 260 be reduced in speed as compared to other fans that do not operate as ion emitter fans 260 in other information handling system which may reduce noise generated. Because the movement of the ions creates an airflow 280, in some embodiments the rotation of the ion emitter fan 260 may be stopped or slowed allowing the cooling of the hardware within the housing of the information handling system by the ion emitter fan cooling system 254 to be accomplished via the airflow created by the creation and movement of the ions from the ion emitter fan 260 to the emitter fan blades 262 by the ion emitter fan 260. In some embodiments where the heat of the hardware within the housing of the information handling system increases, the hardware processor may direct the motor driver hardware 270 to drive the fan motor to rotate the ion emitter fan 260 so that the additional airflow created by the rotation of the emitter fan blades 262 may increase the speed of the airflow further adding controllable levels of cooling with optional noise levels. This allows the noises associated with the rotation of the ion emitter fan 260 to be reduced or even eliminated thereby decreasing the noise heard by the user of the information handling system. This may further increase the user satisfaction of the information handling system as well as comfort to the user during operation of the information handling system by decreasing noises heard by the user.

In an embodiment, the ion collector 268 may include one or more thermal fins (detail not shown). These thermal fins may be used to deionize those gases that where ionized by the ion emitter fan 260. The thermal fins of the ion collector 268 also serve as a heat sink for the heat from the fins to be dissipated by air pumped through the thermal fins with inertia created by the movement of ions from the ion emitter fan 260 the ion collector 268 or from the ion emitter fan 260 rotation. In an embodiment, other thermal fins may be included with or near the ion collector 268 to help dissipate the heat passive or other active cooling elements and may form part of the ion emitter fan cooling system 254 described herein.

In an embodiment, the ion emitter fan housing 256 may include an air intake hole 278 formed parallel to the rotational axis of the ion emitter fan 260 so that air from within the housing of the information handling system may be pulled into the ion emitter fan housing 256. An air outlet hole may be formed into the ion emitter fan housing 256 such as at the ion collector 268 that is perpendicular to the rotational axis of the ion emitter fan 260 to allow air to be expelled out from the ion emitter fan housing 256 and the housing of the information handling system. In an embodiment, the ion emitter fan cooling system 254 may be operatively coupled to other cooling system hardware within the housing of the information handling system such as a heat pipe, vapor chamber, among other thermal conductive materials and devices. A vapor chamber, in an example embodiment, may include a tubular or flat cavity and sealed thermally conductive structure with a working fluid therein. As the vapor chamber receives heat from a source such as the radio module, the working fluid may absorb that heat and move from one state to another (e.g., liquid state into a gas state) as the temperature changes. Heat received in the vapor chamber may be dumped at the second heat conductive element such as thermal fins placed at or near the outlet hole of the ion emitter fan housing 256 such as an ion collector 268.

Figure 3:
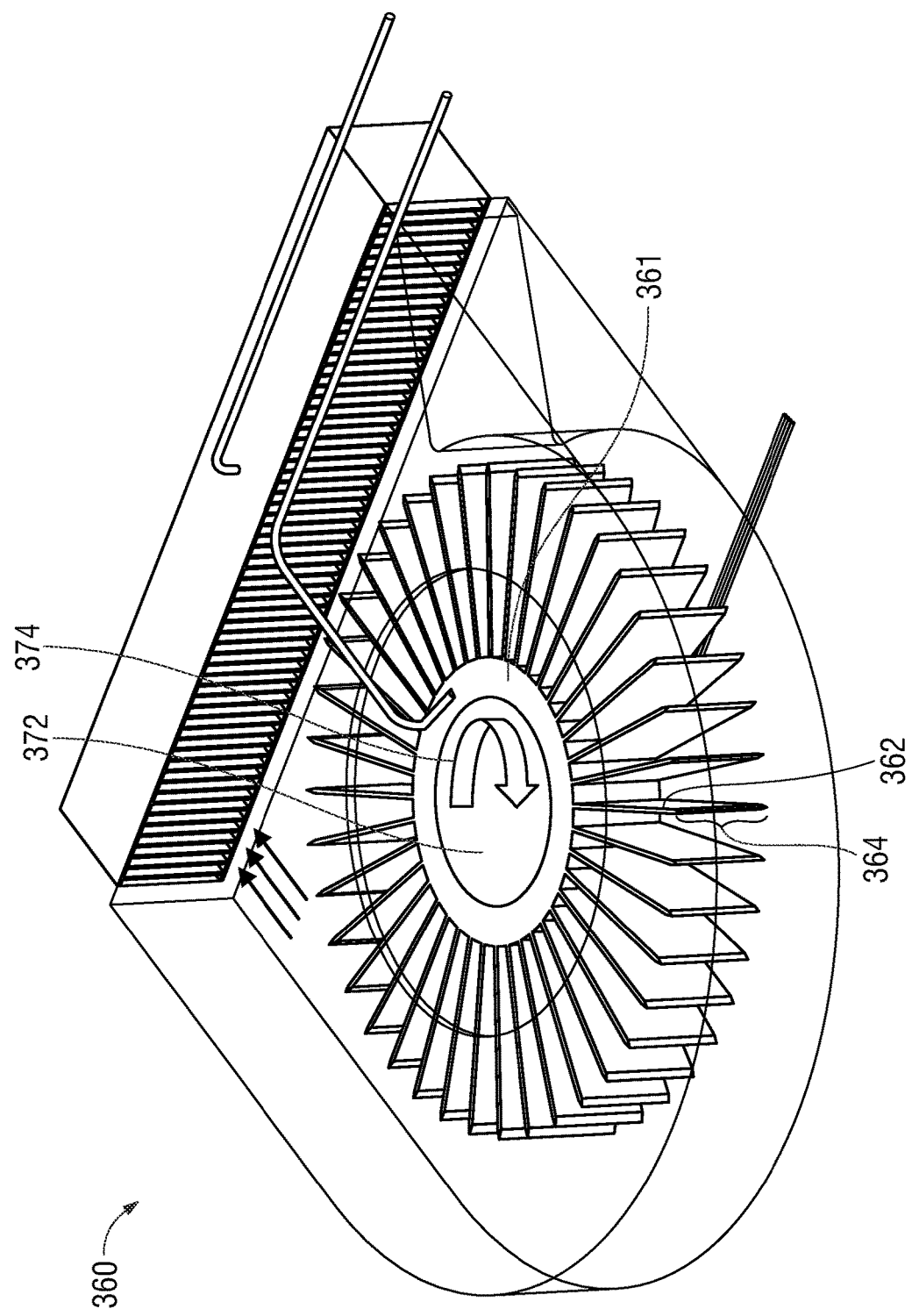
FIG. 3 is a graphic diagram of an ion emitter fan and shaft according to an embodiment of the present disclosure.

FIG. 3 is a graphic diagram of an ion emitter fan 360 according to an embodiment of the present disclosure. As described herein, the ion emitter fan 360 includes a plurality of emitter fan blades 362 used to create an airflow out of the ion emitter fan housing described herein. In an embodiment, the emitter fan blades 362 are made of an electrically conductive material such as a metal. In an embodiment, the ion emitter fan 360 and the emitter fan blades 362 may be made of a refractory metal such as niobium, chromium, molybdenum, tantalum, tungsten, and rhenium among others. In an embodiment, the portions of the ion emitter fan 360 and emitter fan blades 362 may be electroplated with a refractory metal such as niobium, chromium, molybdenum, tantalum, tungsten, and rhenium among others with an interior layer of the ion emitter fan 360 and emitter fan blades 362 being made of a conductive material such as iron. It is appreciated that the ion emitter fan 360 and emitter fan blades 362 may be made of any alloy of metal that includes alloys of those refractory metals described herein.

The number of emitter fan blades 362 may vary depending on an anticipated level airflow needed or fan design used to manage heat generation by the hardware within the information handling system, and the shape and design of the ion emitter fan housing or housing of the information handling system, among other factors. Each of the emitter fan blades 362 are coupled to each other at a conductive central emitter fan hub 361 in an embodiment. In an embodiment, each of the emitter fan blades 362 includes a blade edge 364 as show in the embodiment of FIG. 3. The blade edges 364 may terminate at a shape point such as a knife-like edge. The present specification contemplates that other shapes for terminal points of the emitter fan blades 362 may be used to provide an ionizing source to ionize the gases within the ion emitter fan housing.

As described herein, in an embodiment, the conductive central emitter fan hub 361 of the emitter fan blade 362 may be coupled to an electrically insulating fan hub 372 coupled to a drive shaft of the fan motor (not shown). The electrically insulating fan hub 372 electrically isolates the hardware of the fan motor from the electrically conductive emitter fan blades 362 and conductive central emitter fan hub 361 of the ion emitter fan 360. As will be described herein, the ion emitter fan 360 is electrically coupled to a high voltage source and the insulating fan hub 372 of the fan motor prevents the fan motor from being subjected to these high voltages.

The ion emitter fan 360 may be operatively coupled to a fan motor (not shown but placed under the ion emitter fan 360) used to drive the ion emitter fan 360 causing the ion emitter fan 360 to rotate (e.g., clockwise as indicated by ion emitter fan direction arrow 374) within the ion emitter fan housing. In an embodiment, the fan motor is operatively coupled to motor driver hardware (not shown) via a number of electrical leads. The motor driver hardware may include various circuits used to control the fan motor and increase or decrease the speed of the rotation of the ion emitter fan 360 based on changes in temperature detected within the housing of the information handling system.

Figure 4:
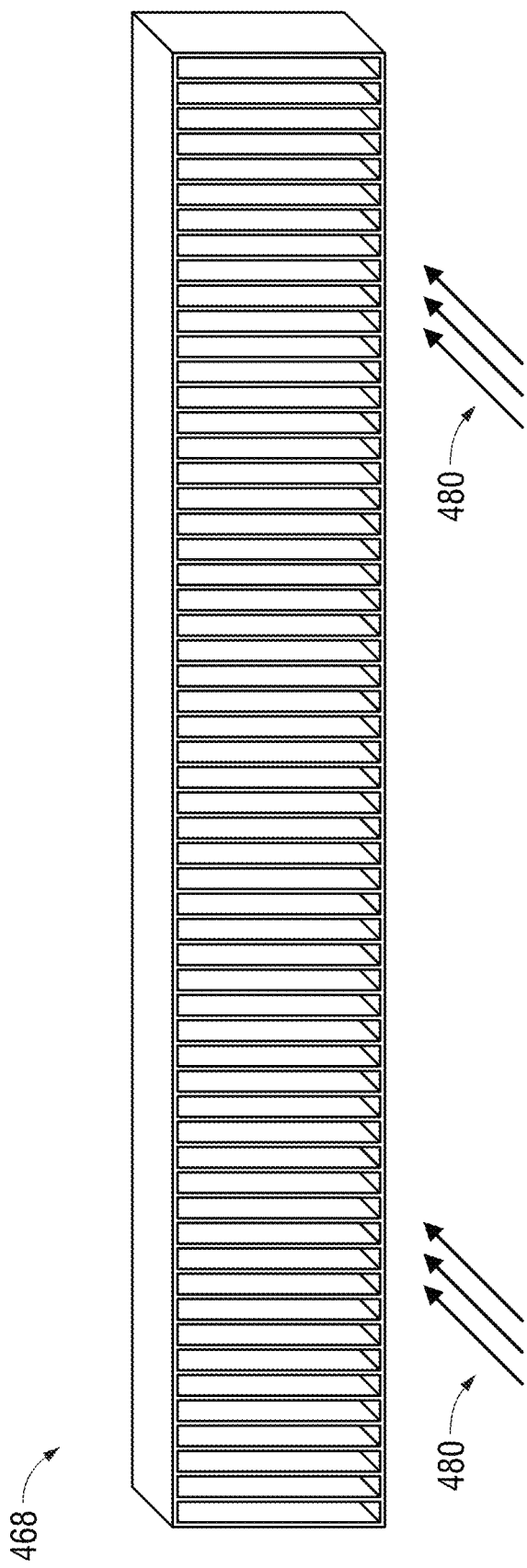
FIG. 4 is a graphic diagram of an ion collector of an ion emitter fan cooling system according to an embodiment of the present disclosure.

FIG. 4 is a graphic diagram of an ion collector 468 of an ion emitter fan cooling system according to an embodiment of the present disclosure. The ion collector 468 may be operatively coupled to the ion emitter fan housing at an airflow exit in the ion emitter fan housing. As described herein, the ion collector 468 is used to deionize those atoms of gas that were ionized by the operation of the ion emitter fan operating as an ion emitter as described herein.

In an embodiment, the ion collector 468 is operatively coupled to a negative electrode of the high voltage source of the ionic driving circuit (not shown). This causes the positively-charged ions created by the ion emitter fan (not shown) to be attracted to the ion collector 468 further causing movement of the positively-charged ions that shear the air in the plasma gap between the emitter and ion collector 468 to create an airflow along ion and airflow direction arrows 480 within the ion emitter fan housing. As the positively-charged ions reach the ion collector 468, those valence electrons removed from the ions by the ion emitter fan may be return to those gases at a neutral electrical charge again by providing free electrons for the deionization process described herein. Following the example of the ionization of the oxygen atoms in the atmospheric gases within the ion emitter fan housing by the ion emitter fan, as these $O^+$ or $O^{2+}$ ions (e.g., cations) have their valence electron shells (e.g., a single electron or two electrons, respectively) replenished and placed in an electrically neutral state.

FIG. 5 is a graphic, cross-sectional diagram of an ion emitter fan cooling system 554 according to an embodiment of the present disclosure. The cross-sectional view presented in FIG. 5 is a cross-section side view as indicated by line "A" in FIG. 2, for example. FIG. 5 shows the emitter fan blades 562 of the ion emitter fan 560 operatively coupled to a central emitter fan hub 561. The central emitter fan hub 561 is operatively coupled to an insulating fan hub 572 driven by motor driver hardware 580, 586.

The ion emitter fan cooling system 554 may include an ion emitter fan housing 556 used to house the components of the ion emitter fan cooling system 554 described herein in an embodiment. In an alternative embodiment, the ion emitter fan cooling system 554 does not include an ion emitter fan housing 556 and instead, those components of the ion emitter fan cooling system 554 are operatively coupled to the housing of the information handling system, for example. For ease of discussion, the ion emitter fan cooling system 554 will be described as including the ion emitter fan housing 556 which allows the ion emitter fan cooling system 554 to be modular and replaced if necessary. In an embodiment, the ion emitter fan housing 556 may be made of plastic or other electrically insulative material. This allows the ion collector 568 to be insulated from the ion emitter fan housing 556 preventing the ion emitter fan housing 556 from electrically forming part of the ion collector 568 and attracting those charged ions created by the ion emitter fan 560 as described herein. In another embodiment, an insulative gasket may separate the ion emitter fan housing 556 from the ion collector 568 preventing a metal ion emitter fan housing 556 from electrically forming part of the ion collector 568.

The ion emitter fan cooling system 554 includes an ion emitter fan 560. The ion emitter fan 560 may include a plurality of emitter fan blades 562 used to create an airflow out of the ion emitter fan housing 556 when rotated. The number of emitter fan blades 562 may vary depending on an anticipated level of airflow needed to manage heat generation by the hardware within the information handling system, and the shape and design of the ion emitter fan housing 556 or housing of the information handling system, among other factors. Each of the emitter fan blades 562 are coupled to each other at a conductive central emitter fan hub 561 in an embodiment. In an embodiment, each of the emitter fan blades 562 includes a blade edge. The blade edges may terminate at any shape point such as a knife-like edge. In an embodiment, the blade edges may be made to come to a sharp point in order to allow for the creation of more ions when the emitter fan operates as an ion emitter. In an embodiment, the ion emitter fan 560 and the emitter fan blades 562 may be made of a refractory metal such as niobium, chromium, molybdenum, tantalum, tungsten, and rhenium among others. In an embodiment, the portions of the ion emitter fan 560 and emitter fan blades 562 may be electroplated with a refractory metal such as niobium, chromium, molybdenum, tantalum, tungsten, and rhenium among others with an interior layer of the ion emitter fan 560 and emitter fan blades 562 being made of a conductive material such as iron. It is appreciated that the ion emitter fan 560 and emitter fan blades 562 may be made of any alloy of metal that includes alloys of those refractory metals described herein.

The ion emitter fan 560 may be operatively coupled to a fan motor used to drive the ion emitter fan 560 causing the ion emitter fan 560 to rotate within the ion emitter fan housing 556. In an embodiment, the fan motor is operatively coupled to motor driver hardware as described herein which includes, in the example embodiment shown in FIG. 5, a wire winding 586 coupled to a bearing 578, a motor driver printed circuit board) PCB 580 and hardware circuitry, and a number of fan control cables 588. The motor driver PCB 580 may include various circuits used to control the speed of the rotation of the emitter fan blades 562 such as resistors, capacitors, alternating current (AC) to direct current (DC) convertors, among other types of circuitries. In an embodiment, the motor driver hardware is operatively coupled to the processor, PMU controller, or other processing resource to control the operation of the motor driver hardware. FIG. 5 shows that the wire winding 586 interacts with one or more magnets 582. In the embodiment shown in FIG. 5, the motor driver hardware on the motor driver PCB 580 may cause a current to pass through the wire winding 586 creating an electromagnet that interacts with the magnets 582. This interaction causes the emitter fan blades 562 to rotate when the wire windings 586 are selectively energized via the motor driver hardware. The wire windings 586 are operatively coupled to a bearing 578. This bearing 578 may house a shaft 584 operatively coupled to an insulating fan hub 572 that allows the shaft 584 and insulating fan hub 572 to rotate within the bearing 578 freely. By including the insulating fan hub 572, the electrical charge applied to the emitter fan blades 562 by the ionic driving circuit is electrically isolated from the motor driver PCB 580 and other motor driver hardware. In an embodiment, the bearing 578 may include non-conductive bearings that electrically isolate the shaft 584 from the bearing 578. It is appreciated that the systems used to drive the emitter fan blades 562 may be different from that shown in FIG. 5 and the present specification contemplates the use of these other driving systems. The rotation of the ion emitter fan 560 may create an airflow within the ion emitter fan housing 556 as described herein. In an embodiment, the conductive central emitter fan hub 561 of the emitter fan blade 562 may be coupled to an insulating fan hub 572 coupled to a drive shaft of the fan motor. In an embodiment, the insulating fan hub 572 may be press fit into a hole formed in the ion emitter fan.

The ion emitter fan 560 may be operatively coupled to an ionic driving circuit 566. In an embodiment, the ionic driving circuit 566 is controlled via the processor, the PMU controller, a hardware controller, other hardware processing resource, or a combination thereof within the information handling system. The ionic driving circuit 566, in an embodiment, includes a high voltage source (e.g., 2 kV to 10 kV voltage source) that is operatively coupled to the ion emitter fan 560 and ion collector 568. In an embodiment, the ionic driving circuit 566 is operatively coupled to the ion emitter fan 560 via a brush contact 596 at the conductive central emitter fan hub 561. In an embodiment, the brush contact 596 is pressed against the ion emitter fan 560 at the conductive central emitter fan hub 561 via a spring 594 to maintain contact between the brush contact 596 and the ion emitter fan 560 to create the charged ions as described herein. In an embodiment, the high voltage source may include a boost converter that steps up voltage from its input (e.g., a battery or A/C power adapter) to the output at the ion emitter fan 560 and/or ion collector 568. As described herein, this high voltage source is electrically insulated from the fan motor driving the ion emitter fan 560 via the insulating fan hub 572. The high voltage source of the ionic driving circuit 566 causes the ion emitter fan 560 to emit ions from the blade edges of each emitter fan blade. In an embodiment, the high voltage source of the ionic driving circuit 566 causes electrons to be emitted from the blade edges of each blade 562 such that gas atoms within the ion emitter fan housing 556 are ionized. This ionization process may include the removal of one or more electrons from the outer valence shells of the individual atoms within the gas such that they become positively charged (e.g., cation). In an example where the interior of the ion emitter fan housing 556 includes atmospheric air, any number of types of gas atoms may be subjected to this process. For example, where the gas includes oxygen (O), the ionization of oxygen may include the removal of a single electron or two electrons to the outermost valence electron shell. This may lead to a $O^+$ or $O^{2+}$ ion (e.g., cation) being created by the ion emitter fan 560 and ionic driving circuit 566 in an embodiment. Other gas atoms or molecules within the atmosphere within the ion emitter fan housing 556 may similarly be ionized such as nitrogen, carbon dioxide, argon, hydrogen, etc.

This ionization of the atmospheric gases within the ion emitter fan housing 556 helps to cause an airflow within the ion emitter fan housing 556 (e.g., into the ion emitter fan housing 556 and out of the ion emitter fan housing 556). In an embodiment, the movement of the ions from the ion emitter fan 560 to the ion collector 568 creates a shearing force on the air (e.g., ionized atoms and non-ionized atoms) within the ion emitter fan housing 556. This shearing force pulls the other air molecules and atoms in the direction that of the electric field pull of the ions created by the ion emitter fan 560 thereby creating this airflow inertia to the ion collector 568. In an embodiment, the movement of the ions created and emitted from the ion emitter fan 560 may be from the ion emitter fan 560 to the ion collector 568. In an example embodiment, the ion emitter fan 560 may be operatively coupled to a positive electrode, for example, of the high voltage source of the ionic driving circuit 566. As a result of creating the positively charged ions, the ion emitter fan 560 now repels those positively charged ions.

In an embodiment, the ion collector 568 is operatively coupled to the negative electrode, for example, of the high voltage source of the ionic driving circuit 566. In an embodiment, the ion collector 568 is operatively coupled to a grounding source of the high voltage source of the ionic driving circuit 566. Whether the ion collector 568 is coupled to a negative electrode of the high voltage source or to ground, and electric field between the ion emitter fan 560 and the ion collector 568 is created and the ions created by the ion emitter fan 560 follow this electric field. In an embodiment where the ion collector 568 is operatively coupled to the negative electrode of the high voltage source and not ground, the ion collector 568 may be electrically insulated from the remaining portions of the ion emitter fan cooling system 554 including the ion emitter fan housing. In an embodiment, this electrical isolation may be accomplished by making the ion emitter fan housing 556 out of an electrically non-conductive material such as plastic. In another embodiment, an insulative gasket (not shown) may be placed between the ion collector 568 and the ion emitter fan housing 556. The electrical isolation of the ion collector 568 allows for the electrical field between the ion emitter fan 560 and ion collector 568 to be formed allowing for an electrical field path for the charged ions to follow. Where the ion collector 568 is operatively coupled to a high voltage source as an anode, for example, the housing of the information handling system may include portions of the housing that prevents a user from touching the ion collector 568 to prevent injury or interference.

In an embodiment, the creation of the electric field between the ion emitter fan 560 and ion collector 568 causes the positively-charged ions created by the ion emitter fan 560 to be attracted to the ion collector 568 further causing movement of the ions and creating an airflow within the ion emitter fan housing 556 as described. As the positively-charged ions reach the ion collector 568, those valence electrons removed from the ions 576 by the ion emitter fan 560 may be added to the valence shells placing those gases at a neutral electrical charge again. Following the example of the ionization of the oxygen atoms in the atmospheric gases within the ion emitter fan housing 556 by the ion emitter fan 560, as these $O^+$ or $O^{2+}$ ions (e.g., cations) have electrons added to their valence electron shells (e.g., a single electron or two electrons, respectively) and placed in an electrically neutral state.

Figure 6:
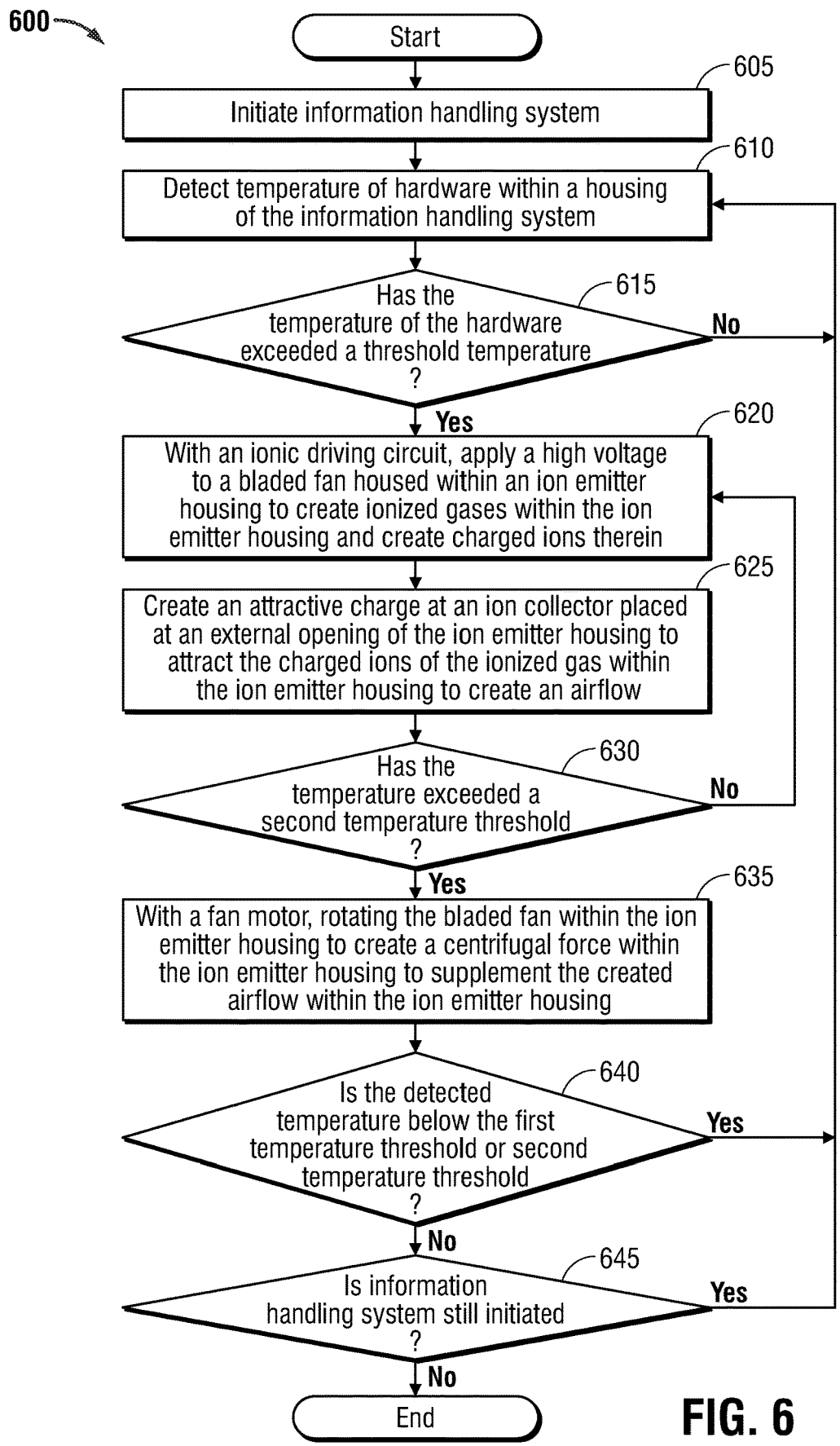
FIG. 6 is a flow diagram of a method of operating an ion emitter fan cooling system of an information handling system according to an embodiment of the present disclosure.

FIG. 6 is a flow diagram of a method 600 of operating an ion emitter fan cooling system of an information handling system according to an embodiment of the present disclosure. The ion emitter fan cooling system described herein may operate with other cooling systems (either passive or active) placed within a housing of the information handling system such as a heat pipe, a set of thermal fins, and/or a vapor tube, among other types of cooling systems.

The method 600 includes, at block 605 with initiating the information handling system. This initiation process may be conducted by the user actuating, for example, a power key on the information handling system. The actuation of this power key may cause the execution of a native BIOS, a native OS, or other code instructions used and executed by the processor of the information handling system to operate the hardware within the information handling system including the ion emitter fan cooling system described herein.

At block 610, the temperature of the hardware within the housing of the information handling system may be detected. In an embodiment, the temperature of the hardware that is detected may using a temperature sensor, such as a thermistor, disposed in the information handling system or coupled to one or more hardware devices such as the processor, PMU controller, or other hardware processing resource, battery, or video display device, for example, of the information handling system among other hardware devices. Other example embodiments may include a processing management system that measures the processing resources consumed by any type of hardware processing device and calculates an interior temperature of the housing of the information handling system.

At block 615, the method 600 may include determining if the temperature of the hardware exceeded a threshold temperature with an ion emitter fan control system. The activation of the cooling systems within the housing of the information as well as the some or all parts of the ion emitter fan cooling system described herein with the ion emitter fan may depend on whether a threshold temperature has been reached. In another example embodiment, the process of determining if the threshold temperature has been achieved may determine whether to initiate the ion emitter fan rotation or whether to increase or decrease the speed of the rotation of the ion emitter fan while the ion emitter fan is also creating ions to generate airflow as described herein. Where the threshold temperature has not been reached at block 615, the method 600 may continue to block 610 to continue monitoring to detect the temperature of the hardware within the housing of the information handling system.

In an embodiment, the activation of the ionic driving circuit to create ions at the blade edges of the emitter fan blade is activated when a first temperature threshold is reached may occur at block 620. Where that first temperature threshold is not reached the ion emitter fan cooling system is not activated and the operation of the information handling system continues, in an embodiment, without the ionic emitter cooling of the hardware within the information handling system and flow returns to block 610 for continued temperature monitoring. Where the first temperature threshold is reached (e.g., 40° C.) at block 620, the activation of the ionic driving circuit causes the charged ions to be created at the emitter fan blades 562 and the creation of airflow within the ion emitter fan housing via the shear forces of the ions moving from the ion emitter fan to the ion collector as described herein at block 625.

In an embodiment, at block 630, the ion emitter fan control system may monitor temperature of the information handling system or its hardware components to deter whether a second temperature threshold is detected. This second threshold temperature may be set to a temperature higher than the temperature of the first temperature threshold. Where this second temperature threshold (e.g., 45° C.) is reached, the ion emitter fan cooling system may be used to activate the rotation of the ion emitter fan to create additional or supplemental airflow through the ion emitter fan housing at block 630. Additional temperature thresholds may also be monitored for (e.g., temperatures above those temperatures associated with the first and second temperature thresholds) that cause the speed of the rotation of the ion emitter fan to be increased in order to create a stronger airflow through the ion emitter fan housing at block 630.

It is appreciated, in some embodiments, that the activation of the ionic driving circuit to create charged ions at the ion emitter fan may be completed when the second temperature threshold is reached while the rotation of the ion emitter fan is initiated when the first temperature threshold is reached in another embodiment. The selective activation of the ionic driving circuit to create charged ions at the ion emitter fan at the first temperature threshold and rotation of the ion emitter fan at the second temperature threshold, in an embodiment, allows for a two-stepped or multi-step cooling process. This two-stepped cooling process provides for silent cooling of the hardware within the housing of the information handling system at a first step and, where increased temperatures are detected (e.g., a second temperature threshold), for supplemental cooling of the hardware within the housing of the information handling system the rotation of the ion emitter fan may be activated which may cause some noise, but reduced fan rotation may still remain relatively quiet. Additional fan speeds may also be activated at additional steps but may cost additional noise as the ion emitter fan rotates faster.

Returning to block 615, where a threshold temperature (e.g., first temperature threshold) has been reached, the method 600 continues to block 620 with applying a high voltage to a bladed fan (e.g., the ion emitter fan described herein) housed within an ion emitter fan housing to create ionized gases within the ion emitter fan housing and create charged ions therein using the ionic driving circuit. In an embodiment, the ionic driving circuit is controlled via the hardware processor of the information handling system, a controller associated with the PMU of the information handling system, other hardware processing resources, or a combination thereof. The ionic driving circuit, in an embodiment, includes a high voltage source that is operatively coupled to the ion emitter fan. The high voltage source of the ionic driving circuit causes the ion emitter fan to generate and repel ions from the blade edges of each emitter fan blade. In the context of the present specification, the term "emit" or "emitter" is meant to describe an action and device that, at its edges, creates/generates ions and, via an electromagnetic repulsion, repels those ions towards an oppositely charged source such as the ion collector described herein. In an embodiment, the high voltage source of the ionic driving circuit causes electrons to be stripped from gas atoms within the ion emitter fan housing causing those gases to be ionized. This ionization process may include the removal of one or more electrons to the outer valence shells of the individual atoms within the gas such that they become positively charged (e.g., cation). In an example where the interior of the ion emitter fan housing includes atmospheric air, any number of types of gas atoms may be subjected to this process. For example, where the gas includes oxygen (O), the ionization of oxygen may include the removal of a single electron or two electrons to the outermost valence electron shell. This may lead to a $O^+$ or $O^{2+}$ ion (e.g., cations) being created by the ion emitter fan and ionic driving circuit in an embodiment. Other gas atoms within the atmosphere within the ion emitter fan housing may similarly be ionized.

In an embodiment, the movement of the ions created and emitted from the ion emitter fan may be from the ion emitter fan to the ion collector at block 625. In an embodiment, an attractive charge, for example, at an ion collector placed at an external opening of the ion emitter fan housing is used to attract the charged ions of the ionized gas within the ion emitter fan housing to create an airflow at block 625. In an example embodiment, the ion emitter fan may be operatively coupled to a positive electrode of the high voltage source of the ionic driving circuit. As a result of creating the positively-charged ions, the ion emitter fan now repels those positively-charged ions. Additionally, in an embodiment, the ion collector is operatively coupled to the negative electrode of the high voltage source of the ionic driving circuit. This causes the positively-charged ions created by the ion emitter fan to be attracted to the ion collector further causing movement of the ions and creating an airflow within the ion emitter fan housing. As the positively-charged ions reach the ion collector, those valence electrons removed from the ions by the ion emitter fan may be replaced thereby placing those gases at a neutral electrical charge again. Following the example of the ionization of the oxygen atoms in the atmospheric gases within the ion emitter fan housing by the ion emitter fan, as these $O^+$ or $O^{2+}$ ions have their valence electron shells (e.g., a single electron or two electrons, respectively) replenished, they are placed in the electrically neutral state. As described herein, the creation of anions by the ion emitter fan and neutralization of those anions by the ion collector is also anticipated.

This ionization of the atmospheric gases within the ion emitter fan housing helps to cause an airflow within the ion emitter fan housing and drawing in heated air from within the housing of the information handling system. In an embodiment, the movement of the positively-charged ions creates a shearing force against other atoms or molecules within the air (ionized or not) thereby creating the airflow described herein.

Proceeding to block 630, the ion emitter fan control system may continue to receive temperature data for temperatures inside the information handling system or for components therein. The ion emitter fan control system may determine whether the temperature has reached a second threshold temperature level (e.g., 45° C.) in an embodiment. If the second temperature threshold has been met in an embodiment, then flow may proceed to block 635 to activate rotation of the ionic emitter fan. If the second temperature threshold has not been met, flow may return to block 620 to continue utilizing the ionic driving circuit to generate airflow with the ionic emitter fan and the collector. It is appreciated that block 630 is an optional embodiment and in other embodiments, a first temperature threshold at block 615 may activate the ionic emitter fan and collector to generate airflow as well as simultaneously activate the ionic emitter fan rotation for airflow in some optional embodiments. Further, additional temperature thresholds may be detected and when reached may adjust rotational fan speed in another embodiment.

At block 635, the method 600 includes rotating the bladed fan within the ion emitter fan housing to create a centrifugal force within the ion emitter fan housing to supplement the created airflow within the ion emitter fan housing. In an embodiment, the activation of the rotation of the bladed fan may be done after a second temperature threshold has been detected by a temperature sensor as described at block 610. In an embodiment, the speed of this rotation may be relatively slower than another fan that is solely used to create the airflow within a fan housing and pull heated air within the housing of the information handling system and pass it out of the information handling system. In an embodiment, the speed of rotation of the bladed fan (e.g., ion emitter fan) may be increased if and when higher temperatures are detected within the housing of the information handling system in order to add to the airflow through the ion emitter fan housing.

At block 640, the ion emitter fan control system may determine whether the temperature inside the information handlings system or at one of the components has fallen below a second or first threshold temperature in an embodiment. If so, then flow may return to block 610 to monitor temperature and the method may proceed as before. If not, flow may proceed to block 645.

The method 600 includes determining, at block 645, whether the information handling system is still initiated. Where the information handling system is no longer initiated (e.g., power has been removed from the information handling system via actuation of a power button), the method 600 may end here. Where the information handling system is still initiated, the method 600 may return to block 640 as described herein.

The blocks of the flow diagrams of FIG. 6 or steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps, or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
a processor;
a memory device;
a power management unit (PMU) to provide power to the processor and the memory device;
an ion emitter fan cooling system including an ion emitter fan housed within an ion emitter fan housing that includes a plurality of emitter fan blades; and
an ionic driving circuit operatively coupled to the ion emitter fan and the plurality of emitter fan blades to couple a first voltage to blade edges of the plurality of emitter fan blades to ionize gases within the ion emitter fan housing and create charged ions to create an airflow to an ion collector and out of an external opening of the ion emitter fan housing, wherein the ion collector includes a plurality of thermal fins to dissipate heat from the information handling system via the airflow created by an attractive movement of ionized gas to the ion collector.

2. The information handling system of claim 1 further comprising:
the ion collector formed at the external opening of the ion emitter fan housing to provide a deionization source for the ionized gas formed at the blade edges of the plurality of emitter fan blades, the ion collector operatively coupled to the ionic driving circuit to create an attractive force via a second voltage at the ion collector to attract the ionized gas to the ion collector.

3. The information handling system of claim 2, wherein the ion collector is disposed across the external opening of the ion emitter fan housing and includes the plurality of thermal fins to dissipate heat from the information handling system via the airflow created by the attractive movement of the ionized gas to the ion collector.

4. The information handling system of claim 1 further comprising:
the ionic driving circuit including a high-voltage electrical source to create excitation of electrons via the first voltage from off of the blade edges of the plurality of emitter fan blades.

5. The information handling system of claim 4, wherein the blade edges of the plurality of emitter fan blades are sharpened edges that function as electron source points.

6. The information handling system of claim 1 further comprising:
the plurality of emitter fan blades rotated via motor driver hardware to create an additional airflow to pass the ionized gas towards the ion collector.

7. The information handling system of claim 1 further comprising:
an electrical isolation hub operatively coupling the ion emitter fan to a fan motor used to rotate the ion emitter fan, where the electrical isolation hub is made of an electrical isolating material.

8. The information handling system of claim 1 further comprising:
a fan motor to drive the plurality of emitter fan blades to increase the airflow to the ion collector formed at the external opening of the ion emitter fan housing.

9. An ion emitter fan cooling system for an information handling system comprising:
an ion emitter fan housing;
an ion emitter fan operatively coupled to a fan motor and housed within the ion emitter fan housing, the ion emitter fan comprising a plurality of emitter fan blades;
an ionic driving circuit operatively coupled to a power source and the ion emitter fan and the plurality of emitter fan blades, the power source to provide a first voltage to ionize gas within the ion emitter fan housing and create charged ions in the ionized gas; and
an ion collector of a conductive material operatively coupled to the power source to create an airflow out of an external opening of the ion emitter fan housing via migration of the ionized gas to the ion collector pulling air to and through the ion collector and a plurality of thermal fins to dissipate heat out of the information handling system.

10. The ion emitter fan cooling system of claim 9 further comprising:
the ion collector formed at the external opening of the ion emitter fan housing to have a second voltage to provide a deionization source for the ionized gas formed at blade edges of the plurality of emitter fan blades, where the second voltage at the ion collector operatively coupled to the ion driving circuit creates an attractive force to attract the ionized gas to the ion collector at the external opening of the ion emitter fan housing.

11. The ion emitter fan cooling system of claim 9, wherein the ion collector is disposed across the external opening of the ion emitter fan housing and includes the plurality of thermal fins to dissipate heat with the airflow created by an attractive movement of air with the migration of the ionized gas to the ion collector.

12. The ion emitter fan cooling system of claim 9 further comprising:
the ionic driving circuit including a high-voltage electrical source to create excitation of electrons between the first voltage from off of blade edges of the plurality of emitter fan blades to a second voltage at the ion collector.

13. The ion emitter fan cooling system of claim 9 further comprising:
the plurality of emitter fan blades rotated via motor driver hardware to further urge the ionized gas towards the ion collector and the airflow out of the external opening of the ion emitter fan housing.

14. The ion emitter fan cooling system of claim 9, wherein blade edges of the plurality of emitter fan blades are sharpened to create one or more electron source points.

15. The ion emitter fan cooling system of claim 9 further comprising:
an electrical isolation hub operatively coupling the ion emitter fan to the fan motor used to rotate the ion emitter fan, wherein the electrical isolation hub is made of an electrical isolating material.

16. The ion emitter fan cooling system of claim 9 further comprising:
the fan motor to drive the plurality of emitter fan blades at a lower speed due to the airflow created by the migration of the ionized gas towards the ion collector formed at the external opening of the ion emitter fan housing due to the ionic driving circuit such that the ionic emitter fan generates less noise when the fan motor rotates the emitter fan.

17. A method of operating an ion emitter fan cooling system of an information handling system comprising:
with an ionic driving circuit, applying a first voltage to an ion emitter fan housed within an ion emitter fan housing to create ionized gas within the ion emitter fan housing and create charged ions therein, wherein the ionic emitter fan includes a plurality of blades; and
with the ionic driving circuit operatively coupled to an ion collector, applying a second voltage to the ion collector to create an airflow to the ion collector and out of an external opening of the ion emitter fan housing, wherein the ion collector includes a plurality of thermal fins to dissipate heat from the information handling system by the airflow created by a movement of air with migration of the ionized gas to the ion collector.

18. The method of claim 17 further comprising:
with a fan motor, turning the ion emitter fan within the ion emitter fan housing to further urge the airflow within the ion emitter fan housing to the external opening.

19. The method of claim 17 further comprising:
detecting a temperature in the information handlings system with a temperature sensor;
executing code instructions of an ion emitter fan control system via a hardware processor to instruct the ionic driving circuit to apply the first voltage to the ion emitter fan and to apply the second voltage to the ion collector when the information handling system temperature reaches a first temperature threshold.

20. Weather The method of claim 19 further comprising: executing the code instructions of the ion emitter fan control system via the hardware processor to instruct a fan motor to turn the ion emitter fan within the ion emitter fan housing to increase the airflow when the information handling system temperature reaches a second temperature threshold.

* * * * *